(12) United States Patent
Park

(10) Patent No.: US 9,514,840 B2
(45) Date of Patent: Dec. 6, 2016

(54) SEMICONDUCTOR MEMORY DEVICE AND METHOD FOR OPERATING THE SAME

(71) Applicant: SK hynix Inc., Gyeonggi-do (KR)

(72) Inventor: Ga-Ram Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 86 days.

(21) Appl. No.: 14/570,967

(22) Filed: Dec. 15, 2014

(65) Prior Publication Data

US 2016/0042805 A1    Feb. 11, 2016

(30) Foreign Application Priority Data

Aug. 5, 2014 (KR) ................. 10-2014-0100378

(51) Int. Cl.
*G11C 17/18* (2006.01)
*G11C 17/16* (2006.01)
*G11C 29/00* (2006.01)

(52) U.S. Cl.
CPC .............. *G11C 17/18* (2013.01); *G11C 17/16* (2013.01); *G11C 29/78* (2013.01); *G11C 29/838* (2013.01)

(58) Field of Classification Search
CPC ....... G11C 17/18; G11C 29/838; G11C 17/16; G11C 29/78
See application file for complete search history.

(56) References Cited

U.S. PATENT DOCUMENTS

| 2006/0227643 | A1* | 10/2006 | Nakagawa | G11C 29/027 365/225.7 |
| 2009/0031078 | A1* | 1/2009 | Warnes | G11C 5/04 711/105 |
| 2010/0161891 | A1* | 6/2010 | Oshima | G06F 12/0246 711/103 |
| 2012/0182816 | A1* | 7/2012 | Ide | G11C 29/56008 365/200 |
| 2013/0003477 | A1* | 1/2013 | Park | G11C 29/027 365/200 |
| 2013/0227344 | A1* | 8/2013 | Sohn | G06F 11/27 714/6.21 |

FOREIGN PATENT DOCUMENTS

KR    1020060114213    11/2006

* cited by examiner

*Primary Examiner* — Douglas King
(74) *Attorney, Agent, or Firm* — IP & T Group LLP

(57) ABSTRACT

A semiconductor memory device includes a fuse portion including a first fuse set having a plurality of first fuses assigned for a first mode and a second fuse set having a plurality of second fuses assigned for a second mode, and a program portion suitable for programming an available fuse among the first fuses included in the first fuse set or programming the second fuses included in the second fuse set in response to a repair control signal in the second mode.

20 Claims, 3 Drawing Sheets

SEMICONDUCTOR MEMORY DEVICE AND METHOD FOR OPERATING THE SAME

CROSS-REFERENCE TO RELATED APPLICATIONS

The present application claims priority of Korean Patent Application No. 10-2014-0100378, filed on Aug. 5, 2014, which is incorporated herein by reference in its entirety.

BACKGROUND

1. Field

Exemplary embodiments of the present invention relate to a semiconductor design technology, and more particularly, to a semiconductor memory device for programming defective address information during a repair operation, and a method for operating the semiconductor memory device.

2. Description of the Related Art

Methods for repairing defective cells are divided into those that are repair in the wafer stage and those that repair in the package stage. Repair operations performed in the package stage are referred to as Post-Package Repair (PPR) operations.

A semiconductor memory device generally includes a fuse circuit capable of programming an address of a repair target memory cell. Herein, a programming operation indicates a series of operations for storing an address of a repair target memory cell in a fuse circuit. The fuse circuit includes a plurality of fuse sets, and the fuse sets are divided into a fuse set to be used during a PPR mode and a fuse set to be used during a test mode, which is not the PPR mode, i.e., a non-PPR mode.

SUMMARY

Exemplary embodiments of the present invention are directed to a semiconductor memory device that may increase the number of fuses for a Post-Package Repair (PPR) mode without increasing the total number of fuses by using fuses that are not used during a non-PPR mode in the PPR mode.

In accordance with an embodiment of the present invention, a semiconductor memory device includes a fuse portion including a first fuse set having a plurality of first fuses assigned for a first mode and a second fuse set having a plurality of second fuses assigned for a second mode; and a program portion suitable for programming an available fuse among the first fuses included in the first fuse set or programming the second fuses included in the second fuse set in response to a repair control signal in the second mode.

The program portion may include a first fuse information storing block suitable for storing first fuse information corresponding to the first fuse set and generating an over-flow signal by determining whether the first fuse set has an unused fuse among the first fuses, a second fuse information storing block suitable for storing second fuse information corresponding to the second fuse set, and a select output block suitable for outputting the first fuse information or the second fuse information in response to the over-flow signal in the second mode.

The program portion may further include a boot-up control block suitable for determining whether the first fuse set and the second fuse set are used and updating the first fuse information and the second fuse inform in a boot-up operation.

The program portion may further include an address latch block suitable for latching defective address information received from an external device.

The program portion may further include a rupture control block suitable for rupturing a fuse corresponding to the first fuse information or the second fuse information outputted from the select output block.

The first fuse information storing block may output the over-flow signal that is disabled when the first fuse set has the available fuse and enabled when the first fuse set has no available fuse.

The select output block may include a select control signal generation unit suitable for receiving a Post-Package Repair (PPR) mode enabling signal that is enabled in the second mode, an extension mode signal and the over-flow signal and generating a select control signal, and a select unit suitable for selectively outputting the first fuse information the second fuse information in response to the select control signal.

The first mode may be a non-post-package repair mode, and the second mode may be a post-package repair mode.

In accordance with another embodiment of the present invention, a semiconductor memory device includes a fuse portion including a first fuse set having a plurality of first fuses assigned for a first mode and a second fuse set having a plurality of second fuses assigned for a second mode, a first fuse information storing portion suitable for outputting first fuse information corresponding to the first fuse set in response to defective address information applied from an external device and generating an over-flow signal by determining whether there is an available fuse among the first fuses in the first fuse set, in the second mode, a second fuse information storing portion suitable for outputting second fuse information corresponding to the second fuse set in response to the defective address information in the second mode; and a select output portion suitable for outputting the second fuse information during a first section where the over-flow signal is enabled and outputting the first fuse information during a second section other than the first section, in response to an extension mode signal in the second mode.

The first fuse information storing portion may output the over-flow signal that is disabled when the first fuse set has the available fuse and is enabled when the first fuse set has no available fuse.

The select output portion may output the first fuse information outputted from the first fuse information storing portion in the first mode.

The select output portion may include a select control signal generation unit suitable for receiving a Post-Package Repair (PPR) mode enabling signal enabled in the second mode, the extension mode signal and the over-flow signal and generating a select control signal, and a select unit suitable for selectively outputting the first fuse information or the second fuse information in response to the select control signal.

The semiconductor memory device may further include a boot-up control portion suitable for determining whether the first fuse set and the second fuse set are used and updating the first fuse information and the second fuse information, in a boot-up operation.

The semiconductor memory device may further include an address latch portion suitable for latching the defective address information.

The semiconductor memory device may further include a rupture control portion suitable for rupturing a fuse corresponding to the first fuse information or the second fuse information outputted from the select output block.

The first mode may be a non-post-package repair mode, and the second mode may be a post-package repair mode.

In accordance with another embodiment of the present invention, a method for operating a semiconductor memory device including a first fuse set and a second fuse set, each of which is formed of a plurality of fuses, includes storing information on available fuses among the plurality of the fuses in the first fuse set and the second fuse set in a boot-up mode and generating an over-flow signal when there is no available fuse included in the first fuse set, determining whether to enter a Post-Package Repair (PPR) mode and an extension mode, selecting second fuse information corresponding to the second fuse set in a first section where the over-flow signal is enabled and selecting first fuse information corresponding to the first fuse set in a second section other than the first section, in response to defective address information applied from an external device in both the PPR mode and the extension mode, and rupturing a fuse corresponding to a selected fuse information.

The method may further include selecting the first fuse information corresponding to the first fuse set in response to the defective address information in a non-PPR mode.

The method may further include selecting the second fuse information corresponding to the second fuse set in response to the defective address information in both the PPR mode and a non-extension mode.

In accordance with another embodiment of the present invention, a semiconductor memory device includes a fuse portion including a first fuse set and a second fuse set, and a program portion suitable for programming a first fuse set in a first mode and programming a first fuse set or a second fuse set in a second mode based on initial fuse information on an available fuse among a plurality of fuses included in the first fuse set.

The program portion may determine the available fuse and update the initial fuse information, in a boot-up operation.

DETAILED DESCRIPTION

Exemplary embodiments of the present invention are described below in more detail with reference to the accompanying drawings. These embodiments are provided so that this disclosure is thorough and complete, and fully conveys the scope of the present invention to those skilled in the art. All "embodiments" referred to in this disclosure refer to embodiments of the inventive concept disclosed herein. The embodiments presented are merely examples and are not intended to limit the inventive concept.

The drawings are not necessarily to scale and, in some instances, proportions may have been exaggerated in order to clearly illustrate features of the embodiments. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 1:
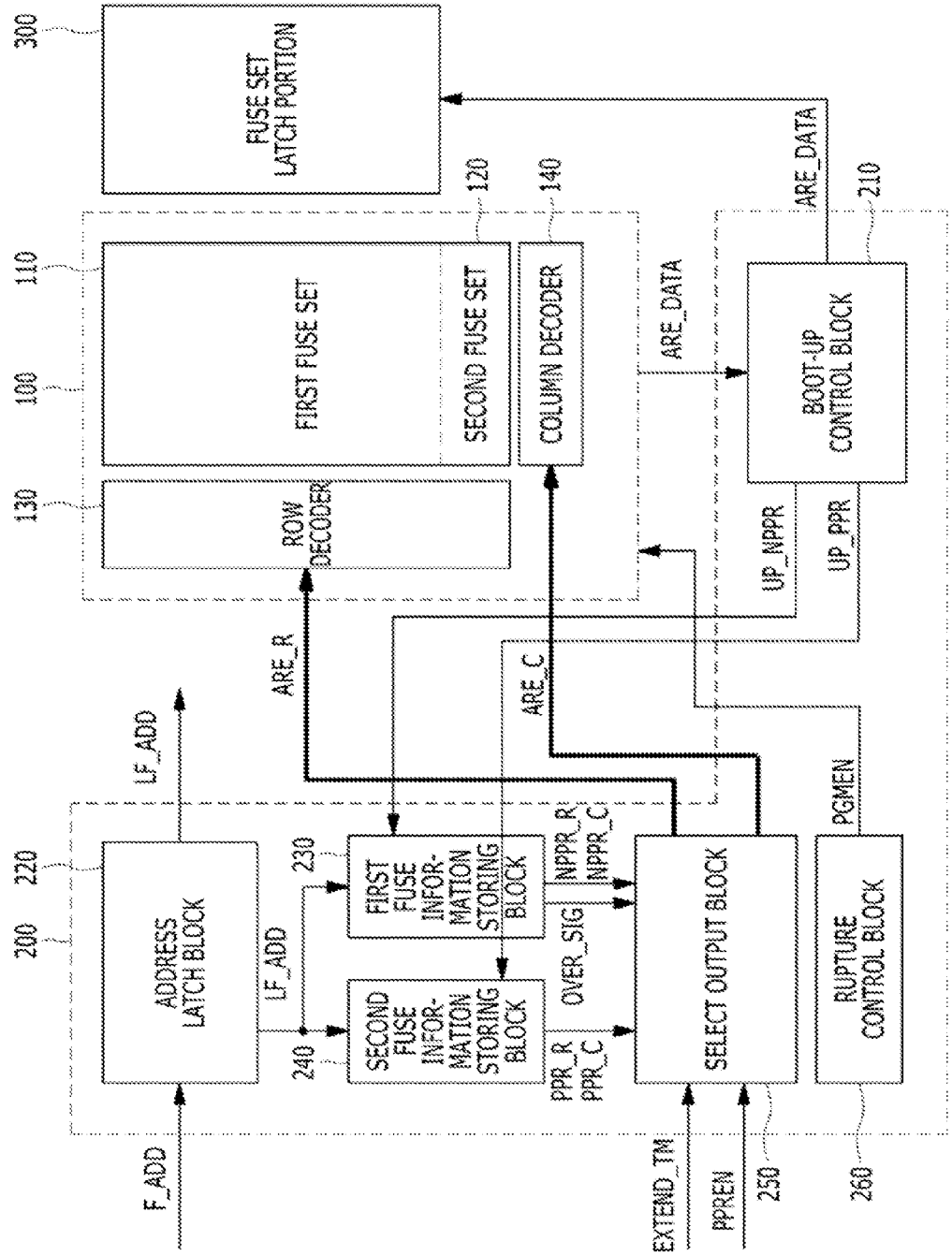
FIG. 1 is a block diagram illustrating a semiconductor memory device in accordance with an embodiment of the present invention.

FIG. 1 is a block diagram illustrating a semiconductor memory device in accordance with an embodiment of the present invention.

Referring to FIG. 1, the semiconductor memory device may include a fuse portion 100, a program portion 200, and a fuse set latch portion 300. The fuse portion 100 may include a first fuse set 110, a second fuse set 120, a row decoder 130, and a column decoder 140.

The first fuse set 110 may include a plurality of fuses assigned for a first mode. The second fuse set 120 may include a plurality of fuses assigned for a second mode. The first and second fuse sets 110 and 120 may program defective address information which is information on a repair target address, through a rupture operation of the program portion 200.

The first mode may be a non-Post-Package Repair (non-PPR) mode. The second mode may be a PPR mode. The non-PPR mode may be a test mode performed before the PPR mode. For example, during the first mode, a package test may be performed in a package stage or a module test may be performed in a module stage. Thus, the first fuse set 110 may indicate a fuse set assigned to be used in the non-PPR mode. The second fuse set 120 may indicate a fuse set assigned to be used in the PPR mode.

Operations of the row decoder 130 and the column decoder 140 included in the fuse portion 100 are described hereafter.

The program portion 200 may include a boot-up control block 210, an address latch block 220, a first fuse information storing block 230, a second fuse information storing block 240, a select output block 250, and a rupture control block 260. The program portion 200 may program an available fuse among fuses included in the first fuse set 110 or the second fuse set 120 in response to a repair control signal. The repair control signal may indicate a plurality of control signals, which is applied from an external device or generated inside the semiconductor memory device in the non-PPR mode or the PPR mode, for performing a repair operation.

The boot-up control block 210 controls a boot-up operation of the semiconductor memory device. The boot-up operation is to store fuse data ARE_DATA programmed in the fuse portion 100 in the fuse set latch portion 300. As the semiconductor memory device performs the boot-up operation during a power-up operation, the semiconductor memory device may sequentially read the fuse data ARE_DATA programmed in the fuse portion 100, and subsequently store the read fuse data ARE_DATA in the fuse set latch portion 300, to perform a repair operation based on the stored fuse data ARE_DATA. When it is determined that the first fuse set 110 and the second fuse set 120 include available fuses, the boot-up control block 210 may output initial fuse information UP_NPPR on the available fuses in the first fuse set 110 to the first fuse information storing block 230 and output initial fuse information UP_PPR on the available fuses in the second fuse set 120 to the second fuse information storing block 240. Since the boot-up operation is repeatedly performed during the power-up operation, the boot-up control block 210 may transmit the fuse information, which is disposition information on the available fuses included in the first and second fuse sets 110 and 220, to the first fuse information storing block 230 and the second fuse information storing block 240, respectively, and update the fuse information.

The address latch block 220 may receive a defective address F_ADD applied from an external device. The address latch block 220 may latch the defective address F_ADD. The defective address F_ADD may include a defective row address and a bank address corresponding to the defective row address. The address latch block 220 may output a latched defective address LF_ADD to the first fuse information storing block 230 and the second fuse information storing block 240.

As described above, the first fuse information storing block 230 and the second fuse information storing block 240 may receive the initial fuse information UP_NPPR and UP_PPR on the available fuses in the first fuse set 110 and the second fuse set 120, respectively, from the boot-up control block 210, and store the initial fuse information UP_NPPR and UP_PPR.

The first fuse information storing block 230 may receive the initial fuse information UP_NPPR, which is the available fuse information in the first fuse set 110, from the boot-up control block 210 and store the initial fuse information UP_NPPR, and it may generate an over-flow signal OVER_SIG by determining whether there is an unused fuse in the first fuse set 110. Since the first fuse information storing block 230 stores the disposition information on the available fuse included in the first fuse set 110, the first fuse information storing block 230 may store available fuse information in the non-PPR mode. When there is no available fuse in the first fuse set 110, that is, all fuses formed in the first fuse set 110 for a repair operation of the non-PPR mode are used, the first fuse information storing block 230 may output the enabled over-flow signal OVER_SIG. The first fuse information storing block 230 that receives the latched defective address LF_ADD from the address latch block 220 may output disposition information on fuses disposed adjacent to a fuse corresponding to the latched defective address LF_ADD among the stored fuse information. To be specific, the first fuse information storing block 230 may receive the latched defective address LF_ADD and output first fuse information NPPR_R and NPPR_C, which is disposition information disposed adjacent to the latched defective address LF_ADD among the stored disposition information.

The second fuse information storing block 240 may receive the initial fuse information UP_PPR which is the available fuse information in the second fuse set 120 from the boot-up control block 210 and store the initial fuse information UP_PPR. Since the second fuse information storing block 240 stores the disposition information on the available fuse included in the second fuse set 120, the second fuse information storing block 240 may store available fuse information in the PPR mode. The second fuse information storing block 240 that receives the latched defective address LF_ADD from the address latch block 220 may output second fuse information PPR_R and PPR_C which is disposition information disposed adjacent to the latched defective address LF_ADD among the stored disposition information.

The select output block 250 may receive the over-flow signal OVER_SIG and the first fuse information NPPR_R and NPPR_C from the first fuse information storing block 230. The select output block 250 may receive the second fuse information PPR_R and PPR_C from the second fuse information storing block 240. The select output block 250 may receive a PPR mode enabling signal PPREN and an extension mode signal EXTEND_TM. The extension mode signal EXTEND_TM may be applied from an external device or generated inside the semiconductor memory device. When the extension mode signal EXTEND_TM is enabled, the semiconductor memory device may enter an extension mode by extending an available fuse area to the first use set 110, not the second fuse set 120 in the PPR mode.

The select output block 250 may selectively output the first fuse information NPPR_R and NPPR_C or the second fuse information PPR_R and PPR_C based on the PPR mode enabling signal PPREN, the extension mode signal EXTEND_TM and the over-flow signal OVER_SIG. The select output block 250 may output the first fuse information NPPR_R and NPPR_C or the second fuse information PPR_R and PPR_C as select information ARE_R and ARE_C to the fuse portion 100. The select output block 250 may output the first fuse information NPPR_R and NPPR_C to the fuse portion 100 when the PPR mode enabling signal PPREN is disabled. The select output block 250 may output the second fuse information PPR_R and PPR_C to the fuse portion 100 when the PPR mode enabling signal PPREN is enabled, and the extension mode signal EXTEND_TM is disabled. When the PPR mode enabling signal PPREN is enabled, and the extension mode signal EXTEND_TM is enabled, the select output block 250 may selectively output the first fuse information NPPR_R and NPPR_C or the second fuse information PPR_R and PPR_C based on the over-flow signal OVER_SIG. In other words, when there is an unused fuse in the first fuse set 110, the select output block 250 may receive the disabled over-flow signal OVER_SIG and output the first fuse information NPPR_R and NPPR_C. When there is no unused fuse in the first fuse set 110, the select output block 250 may receive the enabled over-flow signal OVER_SIG and output the second fuse information PPR_R and PPR_C.

When the semiconductor memory device in accordance with the embodiment of the present invention enters the extension mode in response to the extension mode signal EXTEND_TM enabled in the PPR mode, the select output block 250 may use the first fuse set 110 even in the PPR mode until the over-flow signal OVER_SIG is enabled. Thus, when there is an available fuse in the first fuse set 110 as a result of determining whether there is the available fuse in the first fuse set 110 in the PPR mode, the semiconductor memory device may not use the second fuse set 120 assigned for the PPR mode but may use the first fuse set 110.

The row decoder 130 of the fuse portion 100 may decode the row-based fuse information NPPR_R/PPR_R among the first fuse information NPPR_R and NPPR_C and the second fuse information PPR_R and PPR_C received from the select output block 250 as row select information ARE_R. Consequently, the row decoder 130 may generate a signal for selecting a word line of the first fuse set 110 or the second fuse set 120.

The column decoder 140 of the fuse portion 100 may decode the column-based fuse information NPPR_C/PPR_C among the first fuse information NPPR_R and NPPR_C and the second fuse information PPR_R and PPR_C received from the select output block 250 as column select information ARE_C. Consequently, the column decoder 140 may generate a signal for selecting a bit line of the first fuse set 110 or the second fuse set 120.

The rupture control block 260 may output a rupture enabling signal PGMEN to the fuse portion 100, and the fuse portion 100 that receives the rupture enabling signal PGMEN may perform a rupture operation.

The fuse portion 100 may receive the select information ARE_R and ARE_C outputted from the select output block 250 and the rupture enabling signal PGMEN outputted from the rupture control block 260. The fuse portion 100 may perform the rupture operation in response to the rupture enabling signal PGMEN. The rupture enabling signal PGMEN and the select information ARE_R and ARE_C may be included in the repair control signal. The information on the defective address may be programmed in the select information ARE_R and ARE_C outputted from the select output block 250. Subsequently, the fuse data ARE_DATA, which is the information programmed in the fuse portion 100, may be outputted to the fuse set latch portion 300 and sequentially latched through the boot-up operation. The semiconductor memory device may perform a repair operation based on the latched fuse data ARE_DATA and the latched defective address LF_DATA outputted from the address latch block 220.

Hereafter, an operation of the semiconductor memory device is described.

When a power supply voltage is supplied from an external device in order to operate the semiconductor memory device, the boot-up control block 210 performs a boot-up operation. As the fuse data ARE_DATA stored in the first fuse set 110 and the second fuse set 120 is sequentially read, the fuse data ARE_DATA is latched in the fuse set latch portion 300. As the boot-up control block 210 performs the boot-up operation, the initial fuse information UP_NPPR/UP_PPR, which is the disposition information on the available fuse in the first fuse set 110 and the second fuse set 120, is outputted to the first fuse information storing block 230 and the second fuse information storing block 240, respectively. The first fuse information storing block 230 and the second fuse information storing block 240 store the available fuse information received from the boot-up control block 210.

The operation of the semiconductor memory device in the non-PPR mode will now be described. In the non-PPR mode, the PPR mode enabling signal PPREN and the extension mode signal EXTEND_TM are disabled. The address latch block 220 receives the defective address F_ADD from an external device and latches the defective address F_ADD. The first, fuse information storing block 230 receives the latched defective address LF_-ADD and outputs the first fuse information NPPR_R and NPPR_C, which is the disposition information disposed adjacent to the latched defective address LF_ADD among the stored fuse information. The select output block 250 may output the first fuse information NPPR_R and NPPR_C received from the first fuse information storing block 230 as the select information ARE_R and ARE_C to the row decoder 130 and the column decoder 140. When the rupture enabling signal PGMEN is outputted to the fuse portion 100, the fuse portion 100 programs the information of the defective address by performing a rupture operation of the fuse corresponding to the select information ARE_R and ARE_C in the first fuse set 110. Subsequently, as the boot-up control block 210 sequentially reads the fuse data ARE_DATA programmed in the first fuse set 110, the boot-up control block 210 transmits the read fuse data ARE_DATA to the fuse set latch portion 300.

The operation of the semiconductor memory device performed in the PPR mode and a non-extension mode is described next. The semiconductor memory device receives the enabled PPR mode enabling signal PPREN and the disabled extension mode signal EXTEND_TM. As described above, as the boot-up control block 210 performs the boot-up operation, the disposition information on the available fuse may be updated and stored in the first fuse information storing block 230 and the second fuse information storing block 240. The address latch block 220 receives the defective address F_ADD from an external device and latches the defective address F_ADD. The second fuse information storing block 240 receives the latched defective address LF_ADD and outputs the second fuse information PPR_R and PPR_C, which is the fuse information disposed adjacent to the latched defective address LF_ADD among the stored fuse information. The select output block 250 may output the second fuse information PPR_R and PPR_C, received from the second fuse information storing block 240, as the select information ARE_R and ARE_C to the row decoder 130 and the column decoder 140. When the rupture enabling signal PGMEN is outputted to the fuse portion 100, the fuse portion 100 programs the information of the defective address by performing a rupture operation of the fuse corresponding to the select information ARE_R and ARE_C in the second fuse set 120. Subsequently, as the boot-up control block 210 sequentially reads the fuse data ARE_DATA programmed in the second fuse set 120, the boot-up control block 210 transmits the read fuse data ARE_DATA to the fuse set latch portion 300.

The operation of the semiconductor memory device performed in the PPR mode and the extension mode is described next. Although the operation is performed in the extension mode, the first fuse information NPPR_R and NPPR_C may be selected, or the second fuse information PPR_R and PPR_C may be selected, based on whether there is an available fuse in the first fuse set 110.

When there is no available fuse in the first fuse set 110, in other words, all the fuses included in the first fuse set 110 are used in the non-PPR mode, the first fuse information storing block 230 outputs the enabled over-flow signal OVER_SIG. The address latch block 220 receives the defective address F_ADD from an external device and latches the defective address F_ADD. The second fuse information storing block 240 receives the latched defective address LF_ADD and outputs the fuse information adjacent to the latched defective address LF_ADD among the stored fuse information. The select output block 250 outputs the second fuse information PPR_R and PPR_C received from the second fuse information storing block 240 as the select information ARE_R and ARE_C to the fuse portion 100 based on the over-flow signal OVER_SIG, although the extension mode signal EXTEND_TM is enabled. When the rupture enabling signal PGMEN is outputted from the rupture control block 260 to the fuse portion 100, the fuse portion 100 programs the information of the defective address by performing a rupture operation of the fuse corresponding to the select information ARE_R and ARE_C in the second fuse set 120. Subsequently, as the boot-up control block 210 sequentially reads the fuse data ARE_DATA programmed in the second fuse set 120, the boot-up control block 210 transmits the read fuse data ARE_DATA to the fuse set latch portion 300.

When there is an available fuse in the first fuse set 110, in other words, there is an unused fuse in the first fuse set 110, the first fuse information storing block 230 outputs the disabled over-flow signal OVER_SIG. The address latch block 220 receives the defective address F_ADD from an external device and latches the defective address F_ADD. The first fuse information storing block 230 and the second fuse information storing block 240 receive the latched defective address LF_ADD and output the fuse information adjacent to the latched defective address LF_ADD among the stored fuse information. The select output block 250 receives the extension mode signal EXTEND_TM and outputs the first fuse information NPPR_R and NPPR_C, received from the first fuse information storing block 230 as the select information ARE_R and ARE_C, to the fuse portion 100 based on the over-flow signal OVER_SIG. When the rupture enabling signal PGMEN is outputted from the rupture control block 260 to the fuse portion 100, the fuse portion 100 programs the information of the defective address by performing a rupture operation of the fuse corresponding to the select information ARE_R and ARE_C in the first fuse set 110. Subsequently, as the boot-up control block 210 sequentially reads the fuse data ARE_DATA programmed in the first fuse set 110, the boot-up control block 210 transmits the read fuse data ARE_DATA to the fuse set latch portion 300.

A semiconductor memory device in accordance an embodiment of the present invention may determine whether there is an unused fuse in the first fuse set 110 based on the extension mode signal EXTEND_TM in the PPR mode. When there is an unused fuse in the first fuse set 110, the semiconductor memory device may increase the number of available fuses in the PPR mode by using unused fuses in the first fuse set 110.

Figure 2:
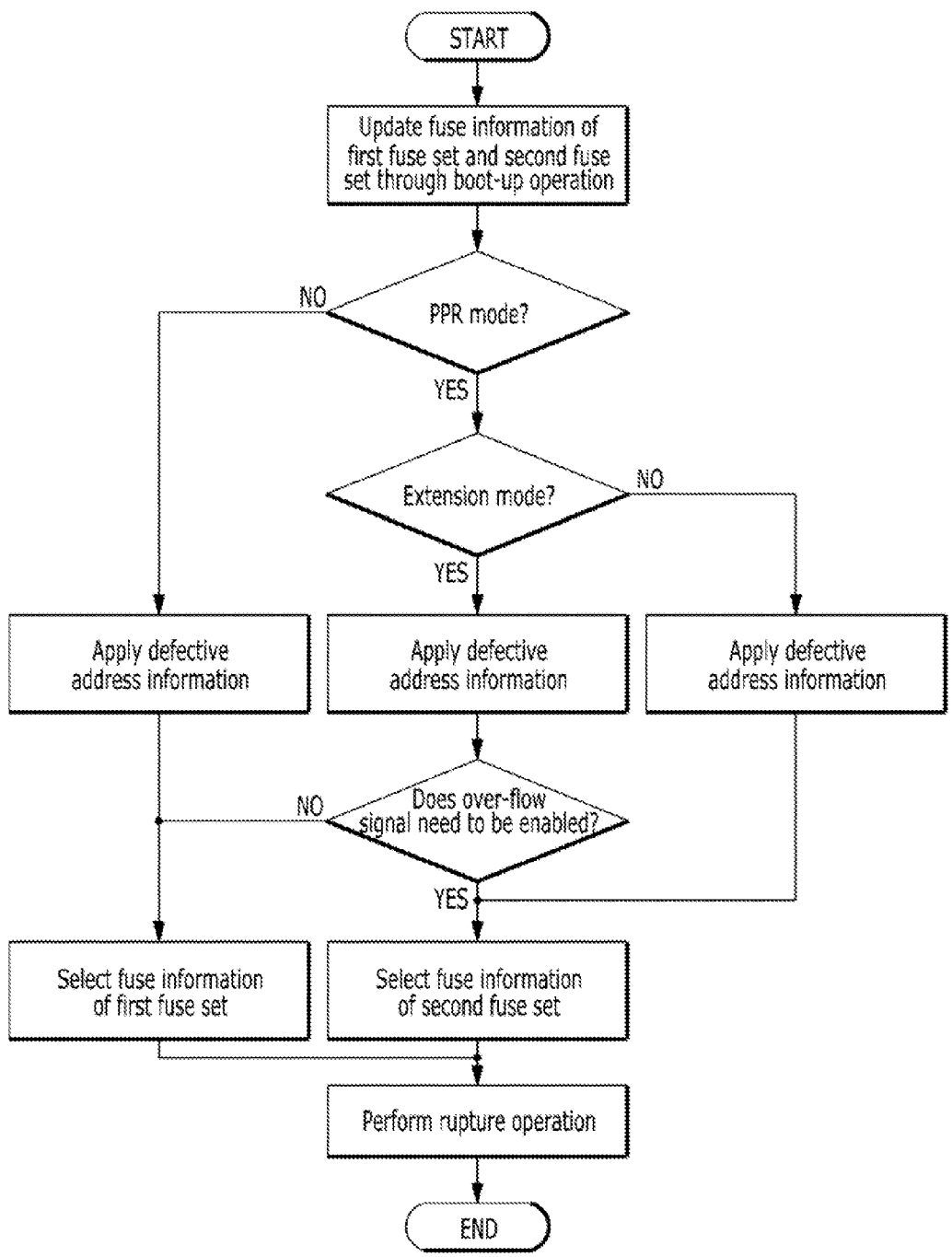
FIG. 2 is a flowchart describing a method for operating the semiconductor memory device shown in FIG. 1.

FIG. 2 is a flowchart describing a method for operating the semiconductor memory device shown in FIG. 1.

Referring to FIG. 2, available fuse information in the first and second fuse sets are updated through a boot-up operation, and the updated fuse information is outputted to the first fuse information storing block and the second fuse information storing block. Subsequently, when the semiconductor memory device does not enter the PPR mode ('NO'), i.e., in the non-PPR mode, defective address information is applied from an external device, and the fuse information of the first fuse set outputted from the first fuse information storing block is selected. A rupture operation of the fuse corresponding to the selected fuse information is performed.

When the semiconductor memory device enters the PPR mode ('YES'), it is determined whether the semiconductor memory device enters the extension mode. When the semiconductor memory device does not enter the extension mode ('NO'), defective address information is applied from an external device, and the fuse information of the second fuse set outputted from the second fuse information storing block, is selected. A rupture operation of the fuse corresponding to the selected fuse information is performed.

When the semiconductor memory device enters the extension mode ('YES'), defective address information is applied from an external device, and it is determined whether to enable the over-flow signal. When the over-flow signal is enabled ('YES'), the fuse information of the second fuse set, outputted from the second fuse information storing block, is selected. A rupture operation of the fuse corresponding to the selected fuse information is performed. When the over-flow signal is disabled ('NO'), the fuse information of the first fuse set, outputted from the first fuse information storing block, is selected. A rupture operation of the fuse corresponding to the selected fuse information is performed.

In accordance with the embodiments of the present invention, whether there is an unused fuse in the first fuse set may be determined in the PPR mode, and the number of the available fuses may increase through the extension mode.

Figure 3:
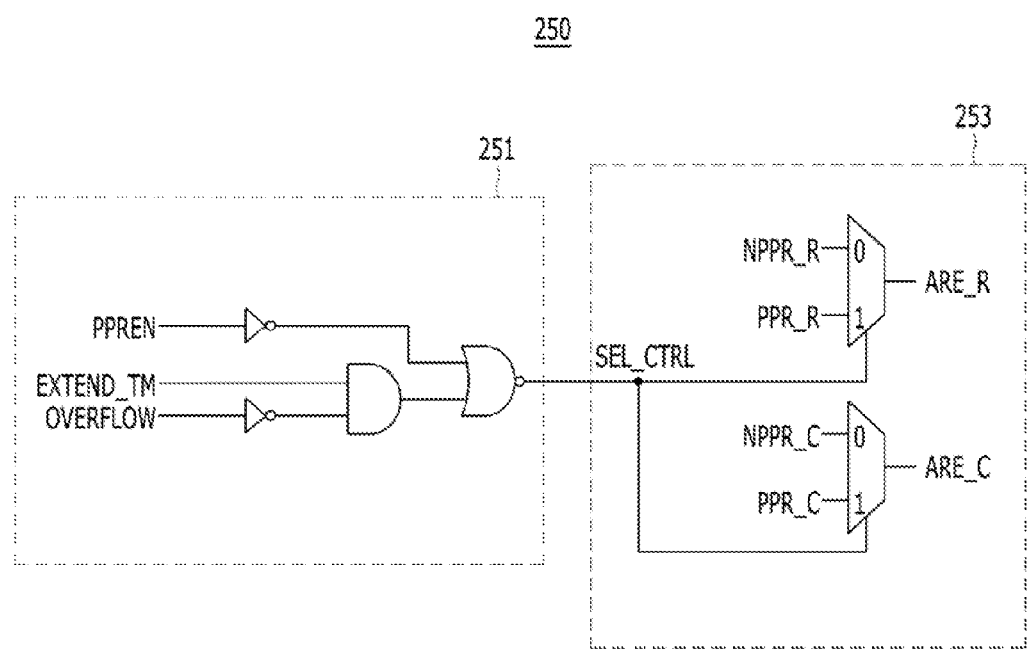
FIG. 3 is a circuit diagram illustrating a select output block shown in FIG. 1.

FIG. 3 is a circuit diagram illustrating the select output block 250 shown in FIG. 1.

Referring to FIG. 3, the select output block 250 may include a select control signal generation unit 251 and a select unit 253.

The select control signal generation unit 251 may include an inverter, an AND gate and a NOR gate. The select control signal generation unit 251 may receive the PPR mode enabling signal PPREN, the extension mode signal EXTEND_TM and the over-flow signal OVER_SIG. The AND gate may receive the extension mode signal EXTEND_TM and a signal obtained by inverting the over-flow signal OVER_SIG through an inverter. The NOR gate may receive an output of the AND gate and a signal obtained by inverting the PPR mode enabling signal PPREN through the inverter. When the PPR mode enabling signal PPREN is enabled, and the extension mode signal EXTEND_TM is enabled, the select control signal generation unit 251 may determine whether to enable a select control signal SEL_CTRL based on the over-flow signal OVER_SIG.

For example, when the semiconductor memory device enters the non-PPR mode, the PPR mode enabling signal PPREN is disabled to a logic low level. Consequently, the NOR gate outputs the select control signal SEL_CTRL of a logic low level.

When the semiconductor memory device enters the PPR mode but does not enter the extension mode, the PPR mode enabling signal' PPREN is enabled to a logic high level, and the extension mode signal EXTEND_TM is disabled to a logic low level. Consequently, the NOR gate outputs the select control signal SEL_CTRL of a logic high level.

When the semiconductor memory device enters the extension mode, the extension mode signal EXTEND_TM is enabled to a logic high level. When the first fuse set has an available fuse the over-flow signal OVER_SIG is disabled to a logic low level. The NOR gate outputs the select control signal SEL_CTRL of a logic low level. When the first use set does not have an available fuse, the over-flow signal OVER_SIG is enabled to a logic high level. Consequently, the NOR gate outputs the select control signal SEL_CTRL of a logic high level.

The select unit 253 may selectively output the first fuse information NPPR_R and NPPR_C or the second fuse information PPR_R and PPR_C in response to the select control signal SEL_CTRL, When the select control signal SEL_CTRL of a logic low level is applied, the select unit 253 may output the first fuse information NPPR_R and NPPR_C as the select information ARE_R and ARE_C. When the select control signal SEL_CTRL of a logic high level is applied, the select unit 253 may output the second fuse information PPR_R and PPR_C as the select information ARE_R and ARE_C.

In other words, when the semiconductor memory device enters the PPR mode, and the extension mode signal EXTEND_TM is enabled and applied, and there is an available fuse in the first fuse set formed for the non-PPR mode, the select unit 253 may select and output the first fuse information NPPR_R and NPPR_C. Until the over-flow signal OVER_SIG has a logic high level, the select unit 253 may select and output the first fuse information NPPR_R and NPPR_C. When the over-flow signal OVER_SIG has the logic high level, the select unit 253 may select and output the second fuse information PPR_R and PPR_C.

In accordance with the embodiments of the present invention, semiconductor memory device production yield may be improved as the semiconductor memory device performs a PPR mode by increasing the number of available fuses in the PPR mode without increasing the total number of fuses.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the scope of the present invention as defined by the following claims.

Also, dispositions and types of the logic gates and transistors described in the aforementioned embodiments may be implemented differently based on the polarity of the inputted signal.

What is claimed is:

1. A semiconductor memory device, comprising:
a fuse portion including a first fuse set having a plurality of first fuses assigned for a first mode and a second fuse set having a plurality of second fuses assigned for a second mode; and
a program portion configured to program an available fuse among the first fuses included in the first fuse set or program the second fuses included in the second fuse set in response to a repair control signal in the second mode,
wherein the program portion includes:
a first fuse information storing block configured to store first fuse information corresponding to the first fuse set and generate an over-flow signal by determining whether the first fuse set has an unused fuse among the first fuses;
a second fuse information storing block configured to store second fuse information corresponding to the second fuse set; and
a select output block configured to output the first fuse information or the second fuse information in response to the over-flow signal in the second mode.

2. The semiconductor memory device of claim 1, wherein the program portion further includes:
a boot-up control block configured to determine whether the first fuse set and the second fuse set are used and update the first fuse information and the second fuse information, in a boot-up operation.

3. The semiconductor memory device of claim 1, wherein the program portion further includes:
an address latch block configured to latch defective address information received from an external device.

4. The semiconductor memory device of claim 1, wherein the program portion further includes:
a rupture control block configured to rupture a fuse corresponding to the first fuse information or the second fuse information outputted from the select output block.

5. The semiconductor memory device of claim 1, wherein the first fuse information storing block outputs the over-flow signal that is disabled when the first fuse set has the available fuse and that is enabled when the first fuse set has no available fuse.

6. The semiconductor memory device of claim 1, wherein the select output block includes:
a select control signal generation unit configured to receive a Post-Package Repair (PPR) mode enabling signal that is enabled in the second mode, an extension mode signal and the over-flow signal and generating a select control signal; and
a select unit configured to selectively output the first fuse information or the second fuse information in response to the select control signal.

7. The semiconductor memory device of claim 1, wherein the first mode is a non-post-package repair mode, and the second mode is a post-package repair mode.

8. A semiconductor memory device, comprising:
a fuse portion including a first fuse set having a plurality of first fuses assigned for a first mode and a second fuse set having a plurality of second fuses assigned for a second mode;
a first fuse information storing portion configured to output first fuse information corresponding to the first fuse set in response to defective address information applied from an external device and configured to generate an over-flow signal by determining whether there is an available fuse among the first fuses in the first fuse set, in the second mode;
a second fuse information storing portion configured to output second fuse information corresponding to the second fuse set in response to the defective address information in the second mode; and
a select output portion configured to output the second fuse information during a first section where the over-flow signal is enabled and output the first fuse information during a second section other than the first section, in response to an extension mode signal in the second mode,
wherein the first section is activated when the extension mode signal and the over-flow signal are enabled in the second mode,
wherein the second section is activated when the extension mode signal is enabled and the over-flow signal is disabled in the second mode.

9. The semiconductor memory device of claim 8, wherein the first fuse information storing portion outputs the over-flow signal that is disabled when the first fuse set has the available fuse and is enabled when the first fuse set has no available fuse.

10. The semiconductor memory device of claim 8, wherein the select output portion outputs the first fuse information outputted from the first fuse information storing portion in the first mode.

11. The semiconductor memory device of claim 8, wherein the select output portion includes:
a select control signal generation unit configured to receive a Post-Package Repair (PPR) mode enabling signal that is enabled in the second mode, the extension mode signal and the over-flow signal and generate a select control signal; and
a select unit configured to selectively output the first fuse information or the second fuse information in response to the select control signal.

12. The semiconductor memory device of claim 8, further comprising:
a boot-up control portion configured to determine whether the first fuse set and the second fuse set are used and updating the first fuse information and the second fuse information, in a boot-up operation.

13. The semiconductor memory device of claim 8, further comprising:
an address latch portion configured to latch the defective address information.

14. The semiconductor memory device of claim 8, further comprising:
a rupture control portion configured to rupture a fuse corresponding to the first fuse information or the second fuse information outputted from the select output block.

15. The semiconductor memory device of claim 8, wherein the first mode is a non-post-package repair mode, and the second mode is a post-package repair mode.

16. A method for operating a semiconductor memory device including a first fuse set and a second fuse set, each of which is formed of a plurality of fuses, comprising:
storing information on available fuses among the plurality of the fuses in the first fuse set and the second fuse set in a boot-up mode and generating an over-flow signal when there is no available fuse included in the first fuse set;
determining whether to enter a Post-Package Repair (PPR) mode and an extension mode;

selecting second fuse information corresponding to the second fuse set in a first section where the over-flow signal is enabled and selecting first fuse information corresponding to the first fuse set in a second section other than the first section, in response to defective address information applied from an external device in both the PPR mode and the extension mode; and rupturing a fuse corresponding to a selected fuse information.

17. The method of claim 16, further comprising:

selecting the first fuse information corresponding to the first fuse set in response to the defective address information in a non-PPR mode.

18. The method of claim 16, further comprising:

selecting the second fuse information corresponding to the second fuse set in response to the defective address information in both the PPR mode and a non-extension mode.

19. A semiconductor memory device, comprising:

a fuse portion including a first fuse set and a second fuse set; and a program portion configured to program a first fuse set in a first mode and program a first fuse set or a second fuse set in a second mode based on initial fuse information on an available fuse among a plurality of fuses included in the first fuse set, wherein the program portion includes:

a first fuse information storing block configured to store first fuse information corresponding to the first fuse set and generate an over-flow signal by determining whether the first fuse set has an unused fuse among the first fuses;

a second fuse information storing block configured to store second fuse information corresponding to the second fuse set; and a select output block configured to output the first fuse information or the second fuse information in response to the over-flow signal in the second mode.

20. The semiconductor memory device of claim 19, wherein the program portion determines the available fuse and updates the initial fuse information, in a boot-up operation.

* * * * *